United States Patent
Binnard (12)

(10) Patent No.: US 6,603,531 B1
(45) Date of Patent: Aug. 5, 2003

(54) STAGE ASSEMBLY INCLUDING A REACTION ASSEMBLY THAT IS CONNECTED BY ACTUATORS

(75) Inventor: Mike Binnard, Belmont, CA (US)

(73) Assignee: Nikon Corporation (JP)

(*) Notice: Subject to any disclaimer, the term of this patent is extended or adjusted under 35 U.S.C. 154(b) by 0 days.

(21) Appl. No.: 09/713,910

(22) Filed: Nov. 16, 2000

(51) Int. Cl.[7] .................. G03B 27/42; G03B 27/58; G03B 27/62
(52) U.S. Cl. ................ 355/53; 355/72; 355/75
(58) Field of Search ................ 355/53, 72–76; 310/10, 12; 318/649, 687; 378/34, 35

(56) References Cited

U.S. PATENT DOCUMENTS

| | | | |
|---|---|---|---|
| 5,208,497 A | * | 5/1993 | Ishii et al. ............ 310/12 |
| 5,280,677 A | | 1/1994 | Kubo et al. |
| 5,815,246 A | * | 9/1998 | Sperling et al. ........ 355/53 |
| 5,864,389 A | | 1/1999 | Osanai et al. |
| 5,969,441 A | * | 10/1999 | Loopstra et al. ........ 310/12 |
| 5,991,005 A | | 11/1999 | Horikawa et al. |
| 6,028,376 A | * | 2/2000 | Osanai et al. ......... 310/12 |
| 6,252,370 B1 | | 6/2001 | Ebihara et al. |
| 6,262,794 B1 | | 6/2001 | Ebihara et al. |
| 6,271,606 B1 | | 8/2001 | Hazelton |
| 6,281,654 B1 | * | 8/2001 | Lee ................... 318/649 |
| 6,322,060 B1 | | 11/2001 | Mayama et al. |
| 6,323,483 B1 | | 11/2001 | Cleveland et al. |
| 6,323,935 B1 | * | 11/2001 | Ebihara et al. ........ 355/53 |
| 6,337,484 B1 | | 1/2002 | Loopstra et al. |
| 6,355,994 B1 | | 3/2002 | Andeen et al. |
| 6,359,679 B1 | | 3/2002 | Ito et al. |
| 6,408,045 B1 | | 6/2002 | Matsui et al. |
| 6,449,030 B1 | | 9/2002 | Kwan |

FOREIGN PATENT DOCUMENTS

| | | |
|---|---|---|
| JP | 7-142331 | 6/1995 |
| JP | 11-362591 | 12/1999 |
| WO | WO 98/28665 | 7/1998 |
| WO | WO 98/40791 | 9/1998 |
| WO | WO 01/47001 | 6/2001 |

OTHER PUBLICATIONS

U.S. patent application Ser. No. 09/721,733, Nishi, filed Nov. 27, 2000.

* cited by examiner

Primary Examiner—Henry Hung Nguyen
(74) Attorney, Agent, or Firm—Steven G. Roeder; Jim Rose

(57) ABSTRACT

A stage assembly (10) for moving and positioning a device (26) is provided herein. The stage assembly (10) includes a stage base (12), a stage (14), a stage mover assembly (16), and a reaction assembly (18). The stage mover assembly (16) moves the stage (14) along an X axis and along a Y axis relative to the stage base (12). The reaction assembly (18) is coupled to the stage mover assembly (16). Uniquely, the reaction assembly (18) reduces the reaction forces created by the stage mover assembly (16) in three degrees of freedom that are transferred to the stage base (12). As provided herein, the reaction assembly (18) includes a first reaction mass (88) and a second reaction mass (90) that move independently along the X axis, along the Y axis and about a Z axis. With this design, stage mover assembly (16) has less influence upon the position of the stage base (12). These features allow for more accurate positioning of the device (26) by the stage assembly (10) and better performance of the stage assembly (10).

35 Claims, 9 Drawing Sheets

STAGE ASSEMBLY INCLUDING A REACTION ASSEMBLY THAT IS CONNECTED BY ACTUATORS

CROSS REFERENCE TO RELATED APPLICATIONS

As far as permitted, the disclosures of (i) U.S. patent application Ser. No. 09/714,598, entitled "A SYSTEM AND METHOD FOR RESETTING A REACTION MASS ASSEMBLY OF A STAGE ASSEMBLY," filed on Nov. 16, 2000, (ii) U.S. patent application Ser. No. 09/714,747, entitled, "STAGE ASSEMBLY INCLUDING A REACTION MASS ASSEMBLY," filed on Nov. 16, 2000, and (iii) U.S. patent application Ser. No. 09/713,911, entitled "STAGE ASSEMBLY INCLUDING A REACTION ASSEMBLY," filed on Nov. 16, 2000, are incorporated herein by reference.

FIELD OF THE INVENTION

The present invention is directed to a stage assembly for moving a device. More specifically, the present invention is directed to a stage assembly including a reaction assembly that is connected by actuators for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle is extremely small. Accordingly, the precise relative positioning of the wafer and the reticle is critical to the manufacturing of high density, semiconductor wafers.

Unfortunately, the wafer stage mover assembly generates reaction forces that can vibrate the wafer stage base and the apparatus frame. The vibration influences the position of the wafer stage base, the wafer stage, and the wafer. As a result thereof, the vibration can cause an alignment error between the reticle and the wafer. This reduces the accuracy of positioning of the wafer relative to the reticle and degrades the accuracy of the exposure apparatus.

In light of the above, one object of the present invention is to provide a stage assembly that precisely positions a device. Another object is to provide a stage assembly that minimizes the influence of the reaction forces of the stage mover assembly upon the position of the stage, the stage base, and the apparatus frame. Still another object is to provide a stage assembly having an improved reaction assembly. Yet another object is to provide an exposure apparatus capable of manufacturing precision devices such as high density, semiconductor wafers.

SUMMARY

The present invention is directed to a stage assembly for moving a device relative to a stage base that satisfies these needs. The stage assembly includes a stage, a stage mover assembly, and a reaction assembly. The stage retains the device. The stage mover assembly is connected to the stage and moves the stage relative to the stage base with at least two degrees of freedom. The reaction assembly is coupled to the stage mover assembly.

Uniquely, as provided herein, the reaction assembly reduces the reaction forces created by the stage mover assembly in at least two degrees of freedom that are transferred to the stage base. As a result thereof, the stage assembly can more accurately position the device. Further, the stage assembly can be used in an exposure apparatus to manufacture high density, high quality semiconductor wafers.

As provided herein, the stage mover assembly can include one or more X stage movers, one or more Y guide movers and one or more Y table movers that are coupled to the reaction assembly. The X stage movers move the stage along an X axis, and about a Z axis, while the Y table movers move the stage along a Y axis. The stage mover assembly generates reaction forces in at least two degrees of freedom.

In the embodiments provided herein, the reaction assembly includes a first reaction mass, a second reaction mass and a reaction base assembly. The reaction masses move relative to the reaction base assembly with at least two degrees of freedom and more preferably, three degrees of freedom. More specifically, the reaction masses independently move along an X axis, along a Y axis, and about a Z axis relative to the reaction base assembly.

Additionally, the stage assembly includes a guide assembly and a pair of Y guide movers that connect the first reaction mass to the second reaction mass.

Preferably, the reaction assembly also includes a reaction mover assembly that adjusts and corrects the position of the reaction masses relative to the reaction base assembly. As provided herein, the reaction mover assembly can independently adjust the position of the reaction masses relative to the reaction base assembly in one degree of freedom and more preferably in three degrees of freedom. For example, the reaction mover assembly can independently move the reaction masses along the X axis, along the Y axis, and about the Z axis relative to the reaction base assembly.

The present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
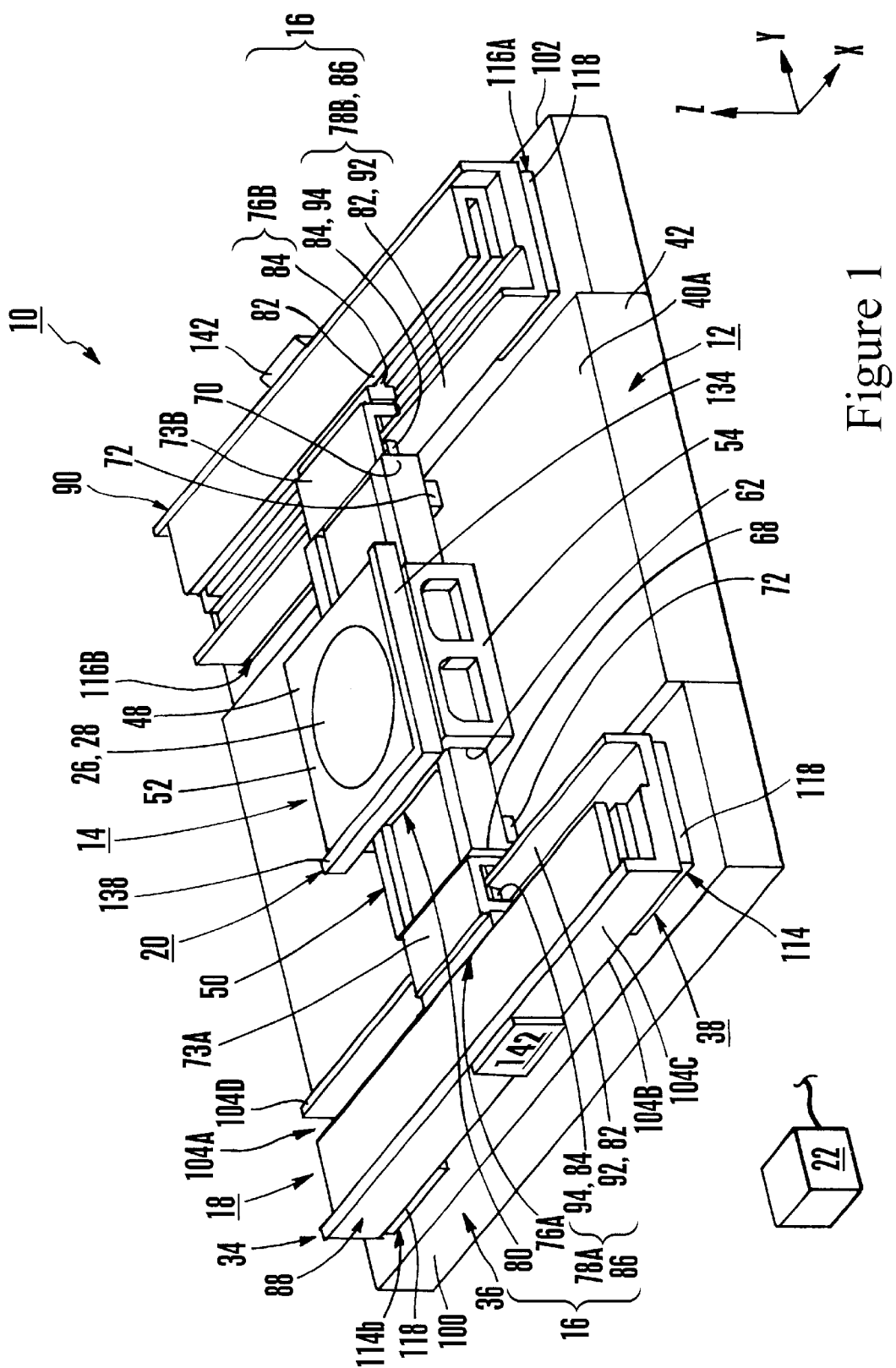
FIG. 1 is a perspective view of a stage assembly having features of the present invention.
Figure 2:
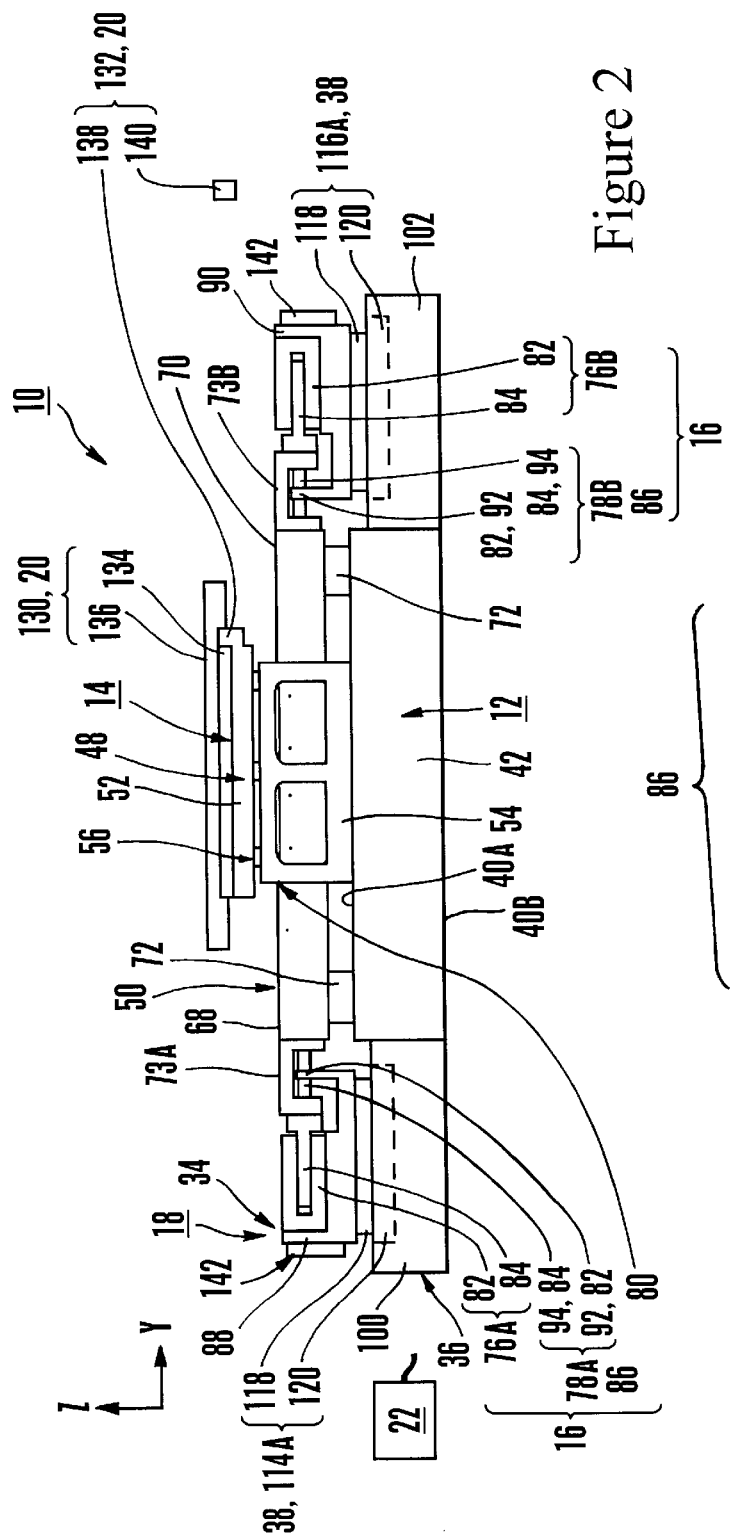
FIG. 2 is side view of the stage assembly of FIG. 1.
Figure 3:
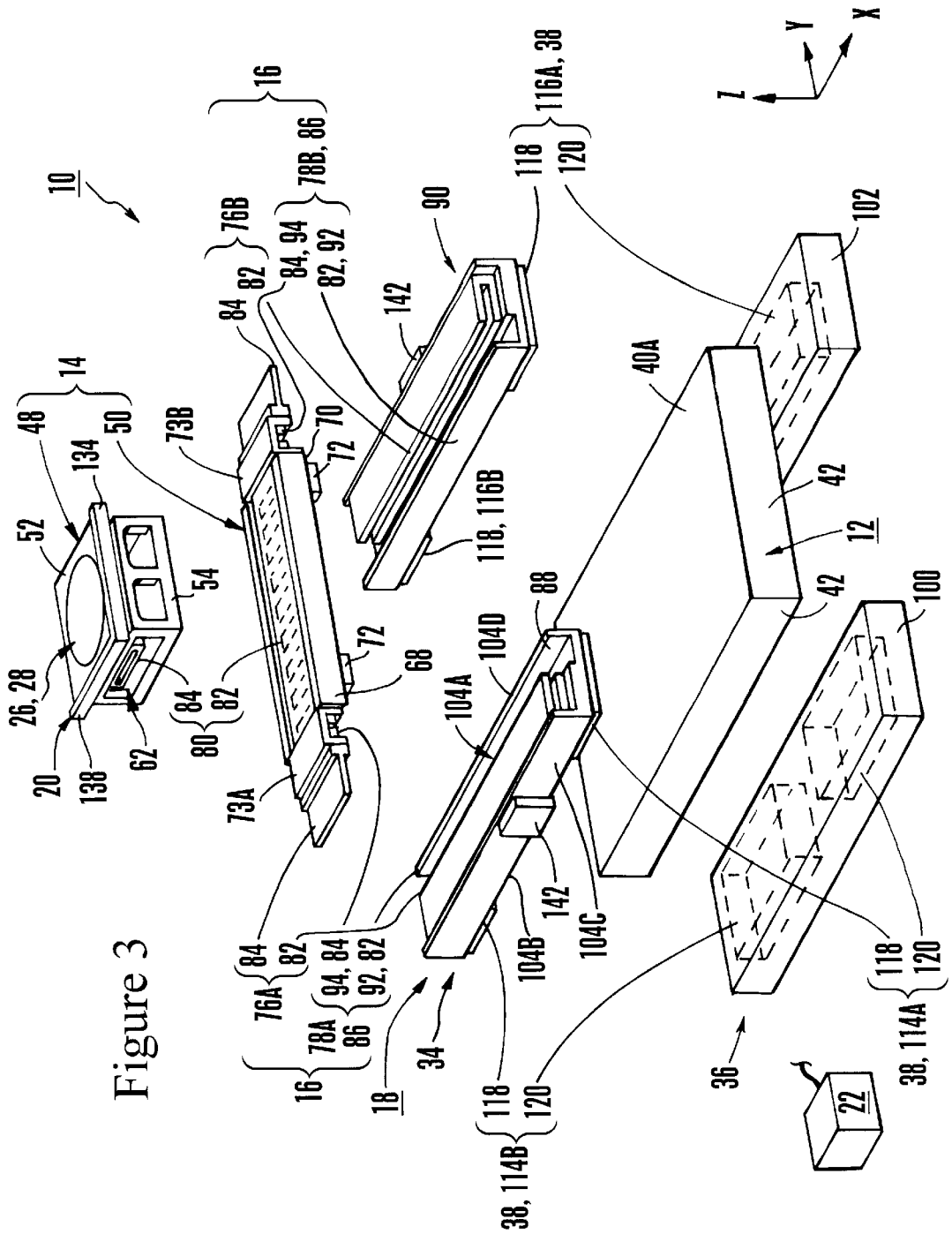
FIG. 3 is a top, exploded perspective view of the stage assembly of FIG. 1.
Figure 4:
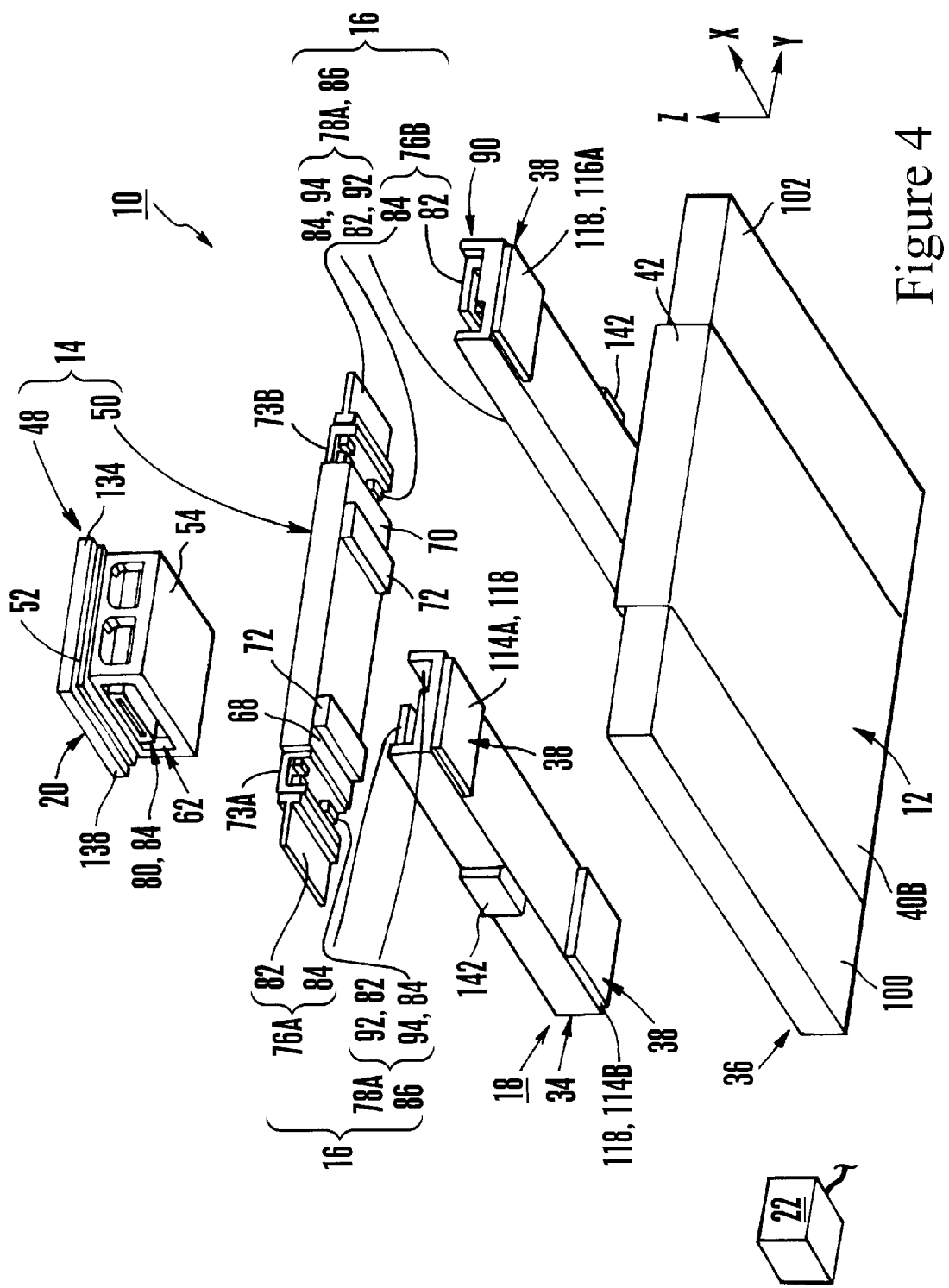
FIG. 4 is a bottom, exploded perspective view of the stage assembly of FIG. 1.

Referring initially to FIGS. 1–4, a stage assembly 10 having features of the present invention, includes a stage base 12, at least one stage 14, a stage mover assembly 16, a reaction assembly 18, a measurement system 20 (only a portion is illustrated in FIGS. 1, 3 and 4), and a control system 22. The stage assembly 10 is positioned above a mounting base 24 (illustrated in FIG. 8). As an overview, the stage mover assembly 16 precisely moves the stage 14 relative to the stage base 12. Further, the reaction assembly 18 reduces and minimizes the amount of reaction forces from the stage mover assembly 16 that are transferred to the stage base 12 and the mounting base 24.

The stage assembly 10 is particularly useful for precisely positioning a device 26 during a manufacturing and/or an inspection process. The type of device 26 positioned and moved by the stage assembly 10 can be varied. For example, the device 26 can be a semiconductor wafer 28 and the stage assembly 10 can be used as part of an exposure apparatus 30 (illustrated in FIG. 8) for precisely positioning the semiconductor wafer 28 during manufacturing of the semiconductor wafer 28. Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 7:
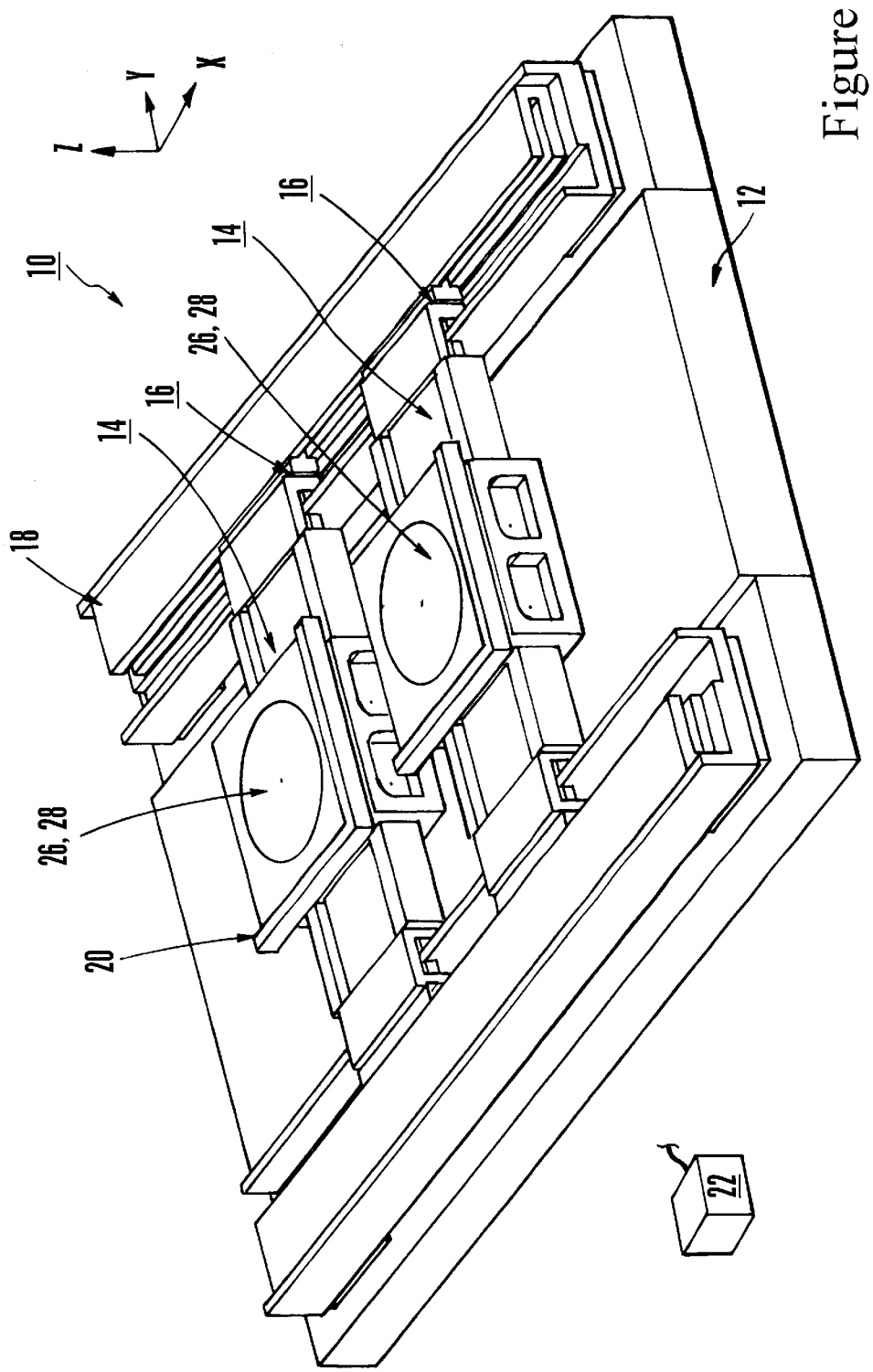
FIG. 7 is a perspective view of another embodiment of a stage assembly having features of the present invention.

In each embodiment illustrated herein, the stage 14 is moved relative to the stage base 12 along the X axis, along the Y axis, and about the Z axis (collectively "the planar degrees of freedom"). More specifically, the stage mover assembly 16 moves and positions the stage 14 along the X axis, along the Y axis, and about the Z axis under the control of the control system 22. Additionally, the stage assembly 10 could be designed to include two or more stages that are moved independently as illustrated in FIG. 7.

Importantly, the reaction assembly 18 reduces and minimizes the amount of reaction force and disturbance from the stage mover assembly 16 that are transferred to the stage base 12 and the mounting base 24. This improves the positioning performance of the stage assembly 10. Further, for an exposure apparatus 30, this allows for more accurate positioning of the semiconductor wafer 28 relative to a reticle 32 (illustrated in FIG. 8).

As an overview, in the embodiments provided herein, the reaction assembly 18 includes a reaction mass assembly 34, a reaction base assembly 36 and a reaction mover assembly 38. The reaction mass assembly 34 moves relative to the reaction base assembly 36 and the stage base 12 with at least two degrees of freedom and more preferably, three degrees of freedom.

In a preferred embodiment of the present invention, the reaction mass assembly 34 is free to move along the X axis, along the Y axis, and about the Z axis relative to the reaction base assembly 36 and the stage base 12. In this embodiment, when the stage mover assembly 16 applies a force to the stage 14 along the X axis, the Y axis, and/or about the Z axis, an equal and opposite force is applied to the reaction mass assembly 34. Further, the control system 22 controls the reaction mover assembly 38 to correct the position of the reaction mass assembly 34 along the X axis, along the Y axis, and about the Z axis.

The stage base 12 supports a portion of the stage assembly 10 above the mounting base 24. The design of the stage base 12 can be varied to suit the design requirements of the stage assembly 10. In the embodiment illustrated in FIGS. 1–4, the stage base 12 is generally rectangular shaped and includes a planar base top 40A (sometimes referred to as a guide face), an opposed base bottom 40B, and four base sides 42.

Figure 8:
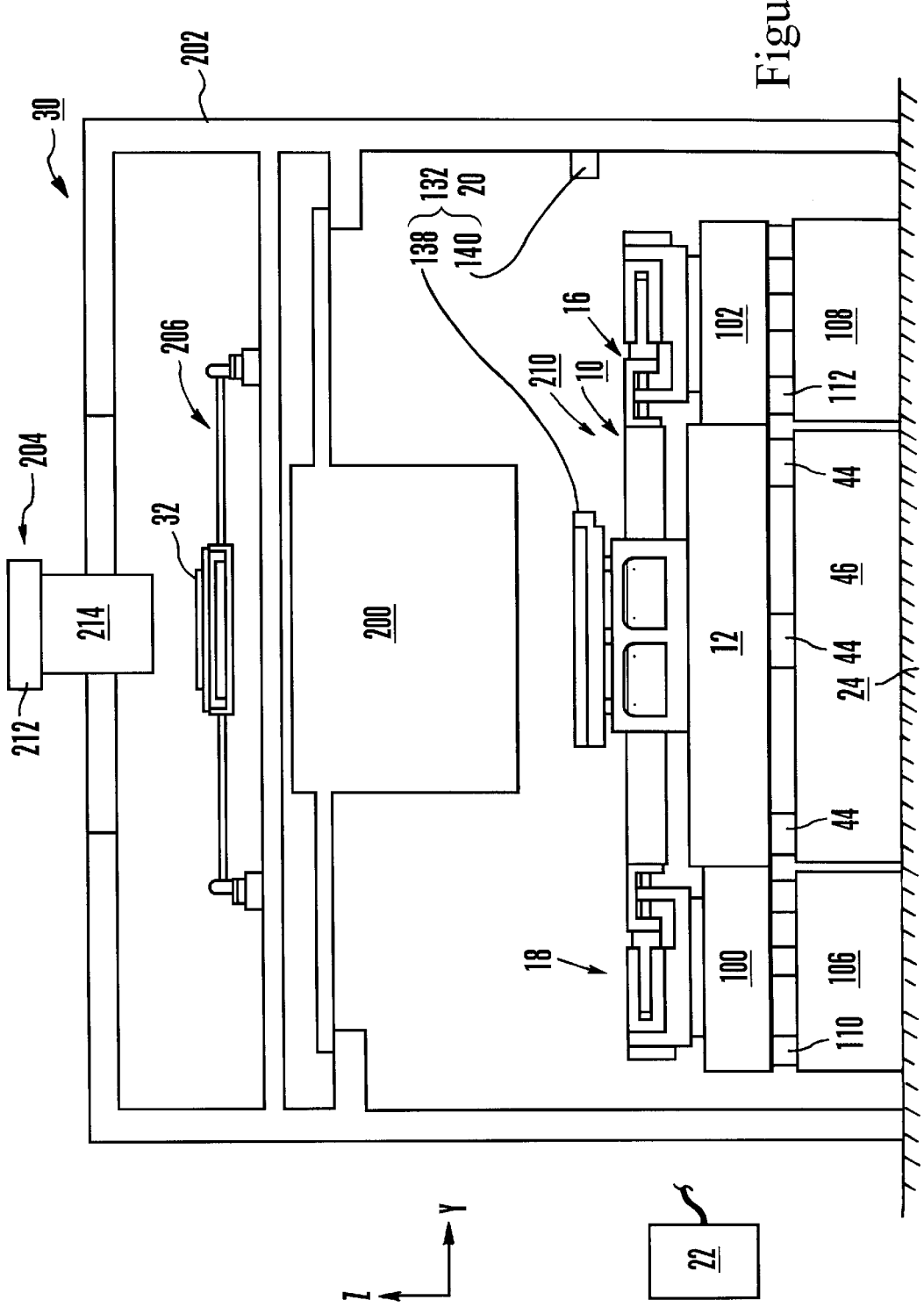
FIG. 8 is a schematic illustration of an exposure apparatus having features of the present invention.

Preferably, referring to FIG. 8, the stage base 12 is secured with resilient base isolators 44 and a base frame 46 to the mounting base 24. The base isolators 44 reduce the effect of vibration of the base frame 46 causing vibration on the stage base 12. Typically, three or four spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

The stage 14 retains the device 26. The stage 14 is precisely moved by the stage mover assembly 16 to precisely position the device 26. The design of each stage 14 can be varied to suit the design requirements of the stage assembly 10. In the embodiment illustrated in the Figures, the stage 14 includes a device table 48, a guide assembly 50, a portion of the stage mover assembly 16, and a portion of the measurement system 20.

The design and movement of the device table 48 can be varied. In the embodiment illustrated in FIGS. 1–4, the device table 48 moves relative to the guide assembly 50 along the Y axis. Further, the device table 48 includes: (i) an upper table component 52, (ii) a lower table component 54 positioned below the upper table component 52, and (iii) a table mover assembly 56 (illustrated in FIG. 2). In this design, the table mover assembly 56 moves the upper table component 52 relative to the lower table component 54.

The upper table component 52 is generally rectangular shaped. The upper table component 52 includes a device holder (not shown) and a portion of the measurement system 20. The device holder retains the device 26 during movement. The device holder can be a vacuum chuck, an electrostatic chuck, or some other type of clamp.

The lower table component 54 is somewhat rectangular tube shaped and includes a guide opening 62. The guide opening 62 is sized and shaped to receive a portion of the guide assembly 50. In the embodiment illustrated in the Figures, the guide opening 62 is generally rectangular shaped and extends longitudinally along the lower table component 54.

In the embodiments provided herein, the device table 48 is maintained above the stage base 12 with a vacuum preload type fluid bearing. More specifically, the bottom of the device table 48 includes a plurality of spaced apart fluid outlets (not shown), and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between the lower table component 54 and the stage base 12. The vacuum preload type fluid bearing allows for motion of the device table 48 relative to the stage base 12 along the X axis, along the Y axis and about the Z axis relative to the stage base 12.

Further, the device table 48 is maintained apart from the guide assembly 50 with a fluid bearing. More specifically, in this embodiment, pressurized fluid (not shown) is released from fluid outlets positioned around the guide opening 62 towards the guide assembly 50 to create a fluid bearing between the lower table component 54 and the guide assembly 50. The fluid bearing allows for motion of the device table 48 relative to the guide assembly 50 along the Y axis. Further, the fluid bearing inhibits motion of the device table 48 relative to the guide assembly 50 along the X axis and about the Z axis.

Alternately, the device table 48 can be supported spaced apart from the stage base 12 and the guide assembly 50 in other ways. For example, a magnetic type bearing (not shown) or a roller bearing type assembly (not shown) could be utilized.

The table mover assembly 56 adjusts the position of the upper table component 52 relative to the lower table component 54 and the stage base 12. The design of the table mover assembly 56 can be varied to suit the design requirements to the stage assembly 10. For example, the table mover assembly 56 can adjust the position of the upper table component 52 and the device holder relative to the lower table component 54 with six degrees of freedom. Alternately, for example, the table mover assembly 56 can be designed to move the upper table component 52 relative to the lower table component 54 with only three degrees of freedom. The table mover assembly 56 can include one or more rotary motors, voice coil motors, linear motors, electromagnetic actuators, or other type of actuators. Still alternately, the upper table component 52 could be fixed to the lower table component 54

The guide assembly 50 is used to move the device table 48 along the X axis and about the Z axis and guide the movement of the device table 48 along the Y axis. Further, the guide assembly 50 functions as a reaction mass along the Y axis. The design of the guide assembly 50 can be varied to suit the design requirements of the stage assembly 10. In the embodiment illustrated in FIGS. 1–4, the guide assembly 50 is generally rectangular shaped and includes a first guide end 68, and a spaced apart second guide end 70.

The guide assembly 50 also includes a pair of spaced apart, guide fluid pads 72. In this embodiment, each of the guide fluid pads 72 includes a plurality of spaced apart fluid outlets (not shown), and a plurality of spaced apart fluid inlets (not shown). Pressurized fluid (not shown) is released from the fluid outlets towards the stage base 12 and a vacuum is pulled in the fluid inlets to create a vacuum preload type, fluid bearing between each of the guide fluid pads 72 and the stage base 12. The vacuum preload type, fluid bearing maintains the guide assembly 50 spaced apart along the Z axis relative to the stage base 12 and allows for motion of the guide assembly 50 along the X axis, along the Y axis, and about the Z axis relative to the stage base 12.

Additionally, the guide assembly 50 includes a first bracket 73A that extends away from the first guide end 68 and a second bracket 73B that extends away from the second guide end 70. The brackets 73A, 73B secure a portion of the stage mover assembly 16 to the guide assembly 50. In the embodiment illustrated in the Figures, each of the brackets 73A, 73B is a generally "C" channel shaped.

The components of the stage 14 can be made of a number of materials including ceramic, such as alumina or silicon carbide; metals such as aluminum; composite materials; or plastic.

The stage mover assembly 16 controls and moves the stage 14 relative to the stage base 12. When the stage mover assembly 16 applies a force to move the stage 14 along the X axis, along the Y axis, and/or about the Z axis, an equal and opposite reaction force is applied to the reaction assembly 18.

The design of the stage mover assembly 16 and the movement of the stage 14 can be varied to suit the movement requirements of the stage assembly 10. In the embodiment illustrated in FIGS. 1–4, the stage mover assembly 16 moves the stage 14 with a relatively large displacement along the X axis, a relatively large displacement along the Y axis, and a limited displacement about the Z axis (theta Z) relative to the stage base 12. In this embodiment, the stage mover assembly 16 includes a first X stage mover 76A, a second X stage mover 76B, a first Y guide mover 78A, a second Y guide mover 78B and a Y table mover 80. The X stage movers 76A, 76B move the stage 14 along the X axis and about the Z axis. The Y guide movers 78A, 78B move the guide assembly 50 along the Y axis and the Y table mover 80 moves the device table 48 along the Y axis. More specifically, in this embodiment, (i) the X stage movers 76A, 76B move the guide assembly 50 with a relatively large displacement along the X axis and with a limited range of motion about the Z axis (theta Z), (ii) the Y guide movers 78A, 78B move the guide assembly 50 with a small displacement along the Y axis, and (iii) the Y table mover 80 moves the device table 48 with a relatively large displacement along the Y axis.

The design of each mover 76A, 76B, 78A, 78B, 80 can be varied to suit the movement requirements of the stage assembly 10. As provided herein, each of the movers 76A, 76B, 78A, 78B, 80 includes a reaction component 82 and an adjacent moving component 84 that interacts with the reaction component 82. In the embodiments provided herein, each of the Y guide movers 78A, 78B includes an opposed pair of attraction type actuators 86. Further, in the embodiments provided herein, for the X stage movers 76A, 76B and the Y table mover 80, one of the components 82, 84 includes one or more magnet arrays (not shown) and the other component 82, 84 includes one or more conductor arrays (not shown).

Each magnet array includes one or more magnets. The design of each magnet array and the number of magnets in each magnet array can be varied to suit the design requirements of the movers 76A, 76B, 80. Each magnet can be made of a permanent magnetic material such as NdFeB.

Each conductor array includes one or more conductors. The design of each conductor array and the number of conductors in each conductor array is varied to suit the design requirements of the movers 76A, 76B, 80. Each conductor can be made of metal such as copper or any substance or material responsive to electrical current and capable of creating a magnetic field such as superconductors.

Electrical current (not shown) is supplied to the conductors in each conductor array by the control system 22. For each mover 76A, 76B, 80, the electrical current in the conductors interacts with the magnetic field(s) generated by the one or more of the magnets in the magnet array. This causes a force (Lorentz type force) between the conductors and the magnets that can be used to move the stage 14 relative to the stage base 12.

Specifically, the reaction component 82 and the moving component 84 of each X stage mover 76A, 76B interact to selectively move the stage 14 along the X axis and about the Z axis relative to the stage base 12. In the embodiment illustrated herein, each X stage mover 76A, 76B is a commutated, linear motor. The reaction component 82 for the first X stage mover 76A is secured to a first reaction mass 88 of the reaction assembly 18 while the moving component 84 of the first X stage mover 76A is secured to the first bracket 73A of the guide assembly 50. Similarly, the reaction component 82 for the second X stage mover 76B is secured to a second reaction mass 90 of the reaction assembly 18 while the moving component 84 of the second X stage mover 76B is secured to the second bracket 73B of the guide assembly 50.

In this embodiment, the reaction component 82 of each X stage mover 76A, 76B includes a pair of spaced apart magnet arrays while the moving component 84 of each X stage mover 76A, 76B includes a conductor array. Alternately, for example, the reaction component 82 can include a conductor array while the moving component 84 can include a pair of spaced apart magnet arrays.

The required stroke of the X stage movers 76A, 76B along the X axis will vary according to desired use of the stage assembly 10. For an exposure apparatus 30, generally, the stroke of the X stage movers 76A, 76B for moving the semiconductor wafer 28 is between approximately two hundred (200) millimeters and one thousand (1000) millimeters.

The X stage movers 76A, 76B also make relatively slight adjustments to position of the stage 14 about the Z axis. In order to make the adjustments about the Z axis, the moving component 84 of one of the X stage movers 76A, 76B is moved relative to the moving component 84 of the other X stage mover 76A, 76B. With this design, the X stage movers 76A, 76B generate torque about the Z axis. A gap (not shown) exists between the reaction component 82 and the moving component 84 of each X stage mover 76A, 76B to allow for slight movement of the stage 14 about the Z axis. Typically, the gap is between approximately one millimeter and five millimeters. However, depending upon the design of the particular mover, a larger or smaller gap may be utilized.

The Y guide movers 78A, 78B selectively move the guide assembly 50 along the Y axis relative to the stage base 12. Further, the Y guide movers 78A, 78B transfer reaction forces from the Y table mover 80 to the reaction masses 88, 90. Stated another way, the first Y guide mover 78A connects the guide assembly 50 to the first reaction mass 88 along the Y axis and the second Y guide mover 78B connects the guide assembly 50 to the second reaction mass 90. Importantly, the Y guide movers 78A, 78B and the guide assembly 50 cooperate to mechanically connect the first reaction mass 88 with the second reaction mass 90. As a result thereof, the present invention can be used to reduce the reaction forces created by the stage mover assembly 16 in at least three degrees of freedom. Further, as a result of this design, the Y guide movers 78A, 78B, the guide assembly 50 and the reaction masses 88, 90 are connected and coupled along the Y axis.

Figure 5:
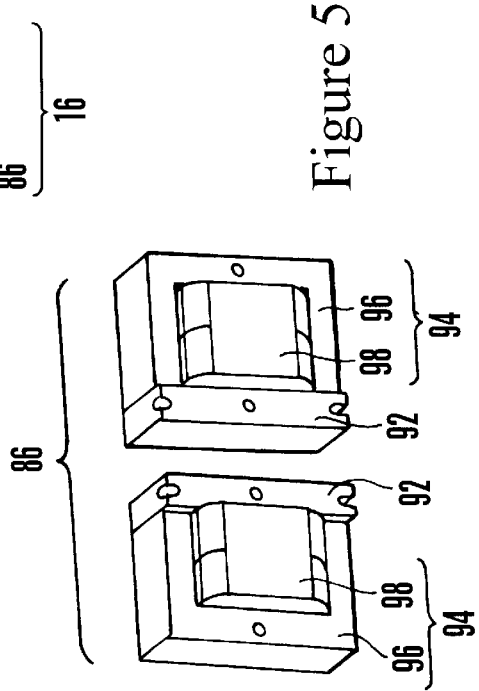
FIG. 5 is a perspective view of a pair of actuators having features of the present invention.

In the embodiment illustrated herein, each of the Y guide movers 78A, 78B include a plurality of opposed pairs of the attraction only type actuators 86. FIG. 5 illustrates a perspective view of a preferred pair of attraction type actuators 86. More specifically, FIG. 5 illustrates a perspective view of a pair of spaced E/I core type electromagnetic actuators.

Each E/I core actuator includes an I shaped core 92 and a combination 94 that includes an E shaped core 96 and a tubular conductor 98. The E core 96 and the I core 92 are each made of a magnetic material such as iron, silicon steel, or Ni—Fe steel. The conductor 98 is positioned around the center bar of the E core 96.

In FIGS. 1–4, each of the Y guide movers 78A, 78B includes (i) a plurality of opposed pairs of the combination 94 of the E core 96 and conductor 98 (the E core and conductor not specifically illustrated in FIGS. 1–4) and (ii) a row of I cores 92. For the first Y guide mover 78A, the opposed pairs of the combination 94 are secured to the first bracket 73A and the row of I cores 92 are secured to the first reaction mass 88. For the second Y guide mover 78B, the opposed pairs of the combination 94 are secured to the second bracket 73B and the row of I cores 92 are secured to the second reaction mass 90. In this embodiment, for each Y guide mover 78A, 78B, the combinations 94 are considered the moving component 84 and the row of I cores 92 is considered the reaction component 82.

The Y table mover 80 moves the stage 14 with a relatively large displacement along the Y axis relative to the stage base 12. More specifically, the reaction component 82 (illustrated in phantom in FIG. 3) and the moving component 84 (illustrated in FIGS. 3 and 4) of the Y table mover 80 interact to selectively move the device table 48 along the Y axis relative to the guide assembly 50. In the embodiment illustrated herein, the Y table mover 80 is a commutated, linear motor. The reaction component 82 for the Y table mover 80 is secured to the guide assembly 50, and the moving component 84 is secured to the device table 48, within the guide opening 62. In this embodiment, the reaction component 82 of the Y table mover 80 includes a conductor array and the moving component 84 of the Y table mover 80 includes a magnet array. Alternately, for example, the reaction component 82 of the Y table mover 80 could include a magnet array while the moving component 84 of the Y table mover 80 could include a conductor array.

With this design, the Y table mover 80 makes relatively large displacement adjustments to the position of the device table 48 along the Y axis. The required stroke of the Y table mover 80 along the Y axis will vary according to desired use of the stage assembly 10. For an exposure apparatus 30, generally, the stroke of the Y table mover 80 for moving the semiconductor wafer 28 is between approximately one hundred (100) millimeters and six hundred (600) millimeters.

Preferably, the movers 76A, 76B, 78A, 78B, 80 are positioned to push through a center of gravity of the device table 48. In the embodiment illustrated herein, the X stage movers 76A, 76B, the Y guide movers 78A, 78B, the Y table mover 80, and the center of gravity of the guide assembly 50 are positioned at approximately the same height along the Z axis as the center of gravity of the device table 48.

The reaction assembly 18 reduces and minimizes the influence of the reaction forces from the stage mover assembly 16 on the position of the stage base 12 and the mounting base 24. The design of the reaction assembly 18 can be varied to suit the design requirements of the stage assembly 10. As provided above, the reaction assembly 18 includes the reaction mass assembly 34, the reaction base assembly 36 and the reaction mover assembly 38. As provided above, the reaction component 82 of each X stage mover 76A, 76B and each Y guide mover 78A, 78B is coupled to the reaction mass assembly 34. With this design, the reaction forces generated by all of the movers 76A, 76B, 78A, 78B, 80 are transferred to the reaction mass assembly 34.

As an overview, through the principle of conservation of momentum, movement of the stage 14 with the X stage movers 76A, 76B along the X axis in one direction, generates an equal but opposite X reaction force that moves the reaction mass assembly 34 in the opposite direction along the X axis. Movement of the device table 48 and/or the guide assembly 50 with the Y movers 78A, 78B, 80 along the Y axis in one direction, generates an equal but opposite Y reaction force that moves the reaction mass assembly 34 in the opposite direction along the Y axis. Additionally, movement of the stage 14 with the movers 76A, 76B, 78A, 78B, 80 can generate a theta Z reaction force (torque) about the Z axis.

The reaction mass assembly 34 includes the first reaction mass 88 and the second reaction mass 90. As provided herein, the reaction masses 88, 90 are free to independently move along the X axis, along the Y axis and about the Z axis to reduce the reaction forces that are transferred to the stage base 12. Thus, the reaction assembly 18 reduces and minimizes the influence of the reaction forces from the stage mover assembly 16 on the position of the stage base 12 and the mounting base 24. This inhibits the reaction forces from the stage mover assembly 16 from influencing the position of the stage base 12 and the device table 48.

The design of the reaction masses 88, 90 can be varied to suit the design requirements of the reaction assembly 18. Preferably, the ratio of the mass of the reaction masses 88, 90 to the mass of the stage 14 is relatively high. This will minimize the movement of the reaction masses 88, 90 and minimize the required travel of the reaction mover assembly 38. A suitable ratio of the mass of the reaction masses 88, 90 to the mass of the stage 14 is between approximately 2:1 and 10:1. A larger mass ratio is better, but is limited by the physical size of the reaction assembly 18.

In the embodiment illustrated in the Figures, each of the reaction masses 88, 90 is somewhat "U" shaped and includes a mass channel 104A, a mass bottom 104B, a mass outer wall 104C, and a mass inner wall 104D. In this embodiment, the reaction component 82 of the first X stage mover 76A is secured to and positioned within the mass channel 104A of the first X reaction mass 88 and the reaction component 82 of the first Y guide mover 78A is secured to mass inner wall 104D of the first X reaction mass 88. Similarly, the reaction component 82 of the second X stage mover 76B is secured to and positioned within the mass channel 104A of the second X reaction mass 90 and the reaction component 82 of the second Y guide mover 78B is secured to mass inner wall 104D of the second X reaction mass 90.

In this embodiment, the reaction masses 88, 90 are maintained above the reaction base assembly 36 with a vacuum preload type fluid bearing. More specifically, in this embodiment, each of the reaction masses 88, 90 include a plurality of spaced apart fluid outlets (not shown), and a plurality of spaced apart fluid inlets (not shown). Pressurized fluid (not shown) is released from the fluid outlets towards the reaction base assembly 36 and a vacuum is pulled in the fluid inlets to create a vacuum preload type, fluid bearing between the reaction masses 88, 90 and the reaction base assembly 36. The vacuum preload type fluid bearing maintains the reaction masses 88, 90 spaced apart along the Z axis, relative to the reaction base assembly 36. Further, the vacuum preload type fluid bearing allows for motion of the reaction masses 88, 90 along the X axis, along the Y axis and about the Z axis relative to the reaction base assembly 36.

Alternately, the reaction masses 88, 90 can be supported spaced apart from the reaction base assembly 36 in other ways. For example, a magnetic type bearing (not shown) or a roller type bearing (not shown) could be utilized that allows for motion of the reaction masses 88, 90 relative to the reaction base assembly 36.

The reaction base assembly 36 supports each of the reaction masses 88, 90 and allows for independent movement of each of the reaction masses 88, 90. The design of the reaction base assembly 36 can be varied. In the embodiment illustrated in the Figures, the reaction base assembly 36 includes (i) a first mass guide 100 for supporting movement of the first reaction mass 88 and (ii) a second mass guide 102 for supporting movement of the second reaction mass 90. In the embodiment illustrated in the Figures, each of the mass guides 100, 102 is substantially flat plate shaped.

As illustrated in FIG. 8, it should be noted that (i) the first mass guide 100 is supported above the mounting base 24 with a first mass frame 106 and (ii) the second mass guide 102 is supported above the mounting base 24 with a second mass frame 108. With this design each of the mass guides 100, 102 is independently secured to the mounting base 24. Further, the mass guides 100, 102 are isolated from the stage base 12.

Preferably, (i) the first mass guide 100 is secured with the first mass frame 106 directly to the mounting base 24, and (ii) the second mass guide 102 is secured with the second mass frame 108 directly to the mounting base 24. Alternately, the first mass guide 100 and the second mass guide 102 can be connected together and can be secured to the mounting base 24 with an isolation system (not shown). Sill alternately, as illustrated in FIG. 8, (i) the first mass guide 100 is secured to the first mass frame 106 with a plurality of resilient first guide isolators 110 and (ii) the second mass guide 102 is secured to the second mass frame 108 with a plurality of resilient second guide isolators 112. The guide isolators 110, 112 reduce the effect of vibration of the mounting base 24 causing vibration on the mass guides 100, 102. Each of the guide isolators 110, 112 can include a pneumatic cylinder (not shown) and an actuator (not shown). Suitable guide isolators 110, 112 are sold by Technical Manufacturing Corporation, located in Peabody, Mass., or Newport Corporation located in Irvine, Calif.

Alternately, for example, the reaction mass guides 100, 102 could be secured to the stage base 12.

The reaction mover assembly 38 independently moves the reaction masses 88, 90 to correct the position of the reaction masses 88, 90 to compensate for external disturbances and/or to reposition the reaction masses 88, 90 for maximum stroke in the future. Preferably, the reaction mover assembly 38 is able to independently move each of the reaction masses 88, 90 along the X axis, along the Y axis and about the Z axis. The reaction mover assembly 38 can include one or more planar motors, rotary motors, voice coil motors, linear motors, electromagnetic actuators, and/or force actuators.

In the embodiment illustrated in the Figures, the reaction mover assembly 38 includes (i) a front first trim mover 114A and a rear first trim mover 114B that collectively move the first reaction mass 88 along the X axis, along the Y axis and about the Z axis, and (ii) a front second trim mover 116A and a rear second trim mover 116B that collectively move the second reaction mass 90 along the X axis, along the Y axis and about the Z axis. In this embodiment, each of the trim movers 114A, 114B, 116A, 116B includes a first component 118, and an adjacent second component 120 (illustrated in phantom in FIGS. 2 and 3).

Specifically, the first component 118 and the second component 120 for each of the first trim movers 114A, 114B interact to selectively move the first reaction mass 88 along the X axis, along the Y axis and about the Z axis relative to the first mass guide 100. In the embodiments provided herein, each of the first trim movers 114A, 114B is commonly referred to as a planar electric motor. In the design provided herein, for each of the planar electric motors, the first component 118 moves relative to the second component 120 along the X axis, along the Y axis and about the Z axis. For the front first trim mover 114A, the first component 118 is secured to the front bottom of the first reaction mass 88, while the second component 120 is positioned within the first mass guide 100. For the rear first trim mover 114B, the first component 118 is secured to the rear bottom of the first reaction mass 88, while the second component 120 is positioned within the first mass guide 100.

Similarly, the first component 118 and the second component 120 for each of the second trim movers 116A, 116B interact to selectively move the second reaction mass 90 along the X axis, along the Y axis and about the Z axis relative to the second mass guide 102. In the embodiments provided herein, each of the second trim movers 116A, 116B is commonly referred to as a planar electric motor. In the design provided herein, for each of the planar electric motors, the first component 118 moves relative to the second component 120 along the X axis, along the Y axis and about the Z axis. For the front second trim mover 116A, the first component 118 is secured to the front bottom of the second reaction mass 90, while the second component 120 is positioned within the second mass guide 102. For the rear second trim mover 116B, the first component 118 is secured to the rear bottom of the second reaction mass 90, while the second component 120 is positioned within the second mass guide 102.

In the embodiments provided herein, one of the components 118, 120 of each trim mover 114A, 114B, 116A, 116B includes one or more planar magnet arrays (not shown) and the other component 118, 120 of each trim mover 114A, 114B, 116A, 116B includes one or more planar conductor arrays (not shown). Each magnet array includes a plurality of spaced apart magnets and each conductor array includes a plurality of spaced apart conductors. The size and shape of each conductor array and the magnet array and the components of the conductor array and the magnet array can be varied to suit the design requirements of each electric motor.

As provided herein, electrical current (not shown) is individually supplied to each conductor array by the control system 22. For each trim mover 114A, 114B, 116A, 116B, the electrical current through the conductors causes the conductors to interact with the magnetic field of the magnets. This generates a force (Lorentz type force) between the magnets and the conductors which can be used to control, move, and position one of the components 118, 120 relative to the other one of the components 118, 120.

For the embodiments, the first component 118 of each trim mover 114A, 114B, 116A, 116B can be a magnet array and the second component 120 can be a conductor array. Thus, for each trim mover 114A, 114B, 116A, 116B, the magnet array moves relative to each conductor array.

Preferably, if the second component 120 of each trim mover 114A, 114B, 116A, 116B is a conductor array, the conductors are individually controlled and switched electrically with the control system 22 so that only conductors wholly and/or partially covered by the magnet array are energized. In other words, only conductors that are in a position to interact with the magnetic field of the magnet array are energized. The current level for each conductor is controlled and adjusted by the controller to achieve the desired resultant forces. Not applying current to the conductors outside of the magnetic field of the magnet array minimizes heat created by the conductor array.

The measurement system 20 monitors movement of the stage 14 relative to the stage base 12, or to some other reference such as an optical assembly 200 (illustrated in FIG. 8). With this information, the stage mover assembly 16 can be used to precisely position of the stage 14. The design of the measurement system 20 can be varied. For example, the measurement system 20 can utilize laser interferometers, encoders, and/or other measuring devices to monitor the position of the stage 14.

Typically, the measurement system 20 monitors the position of the device table 48 along the X axis, along the Y axis, and about the Z axis. More specifically, the measurement system 20 measures the position of the device table 48 relative to the guide assembly 50 along the Y axis, and the measurement system 20 measures the position of the device table 48 along the Y axis, along the X axis, and about the Z axis relative to the optical assembly 200.

As provided herein, the measurement system 20 can utilize a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Additionally, the measurement system 20 includes an XZ interferometer 130 and a Y interferometer 132. The XZ interferometer 130 includes an XZ mirror 134 and an XZ block 136. The XZ block 136 interacts with the XZ mirror 134 to monitor the location of the device table 48 along the X axis and about the Z axis (theta Z). More specifically, the XZ block 136 generates a pair of spaced apart laser signals (not shown) that are reflected off of the XZ mirror 134. With this information, the location of the device table 48 along the X axis and about the Z axis can be monitored. Further, because the device table 48 does not move relative to the guide assembly 50 along the X axis or about the Z axis, the location of the guide assembly 50 along the X axis and about the Z axis can also be monitored by the XZ interferometer 130.

In the embodiment illustrated in the Figures, the XZ mirror 134 is rectangular shaped and extends along one side of the device table 48. The XZ block 136 is positioned away from the device table 48. The XZ block 136 can be secured to the apparatus frame 202 (illustrated in FIG. 8) or some other location that is isolated from vibration.

Somewhat similarly, the Y interferometer 132 includes a Y mirror 138 and a Y block 140. The Y mirror 138 interacts with the Y block 140 to monitor the position of the device table 48 along the Y axis. More specifically, the Y block 140 generates a laser signal that is reflected off of the Y mirror 138. With this information, the location of the device table 48 along the Y axis can be monitored. Further, because the position of the device table 48 relative to the guide assembly 50 along the Y axis is measured with the encoder, the position of the guide assembly 50 along the Y axis can also be monitored.

In the embodiment illustrated in the Figures, the Y mirror 138 is rectangular shaped and is positioned along one of the sides of the device table 48. The Y block 140 is positioned away from the device table 48. The Y block 140 can be secured to the apparatus frame 202 (illustrated in FIG. 8) or some other location that is isolated from vibration.

Additionally, the measurement system 20 includes one or more mass measuring devices 142 such as laser interferometers, encoders, and/or other sensors to monitor (i) the position of the first reaction mass 88 relative to the first mass guide 100, and (ii) the position of the second reaction mass 90 relative to the second mass guide 102.

The control system 22 controls the stage mover assembly 16 to precisely position the stage 14 and the device 26. In the embodiment illustrated herein, the control system 22 directs and controls the current to the conductor array for each of the X stage movers 76A, 76B to control movement of the stage 14 along the X axis and about the Z axis. Similarly, the control system 22 directs and controls the current to conductor array of the Y table mover 80 and the conductors 98 of the Y guide movers 78A, 78B to control movement of the stage 14 along the Y axis.

Additionally, the control system 22 directs and controls current to the reaction mover assembly 38 to control the position of the reaction masses 88, 90. More specifically, the control system 22 directs current to (i) the conductor array for each first trim movers 114A, 114B to independently control the position of the first reaction mass 88 along the X axis, along the Y axis and about the Z axis relative to the first mass guide 100, and (ii) the conductor array for each second trim mover 116A, 116B to independently control the position of the second reaction mass 90 along the X axis, along the Y axis and about the Z axis relative to the second mass guide 102.

Figure 6:
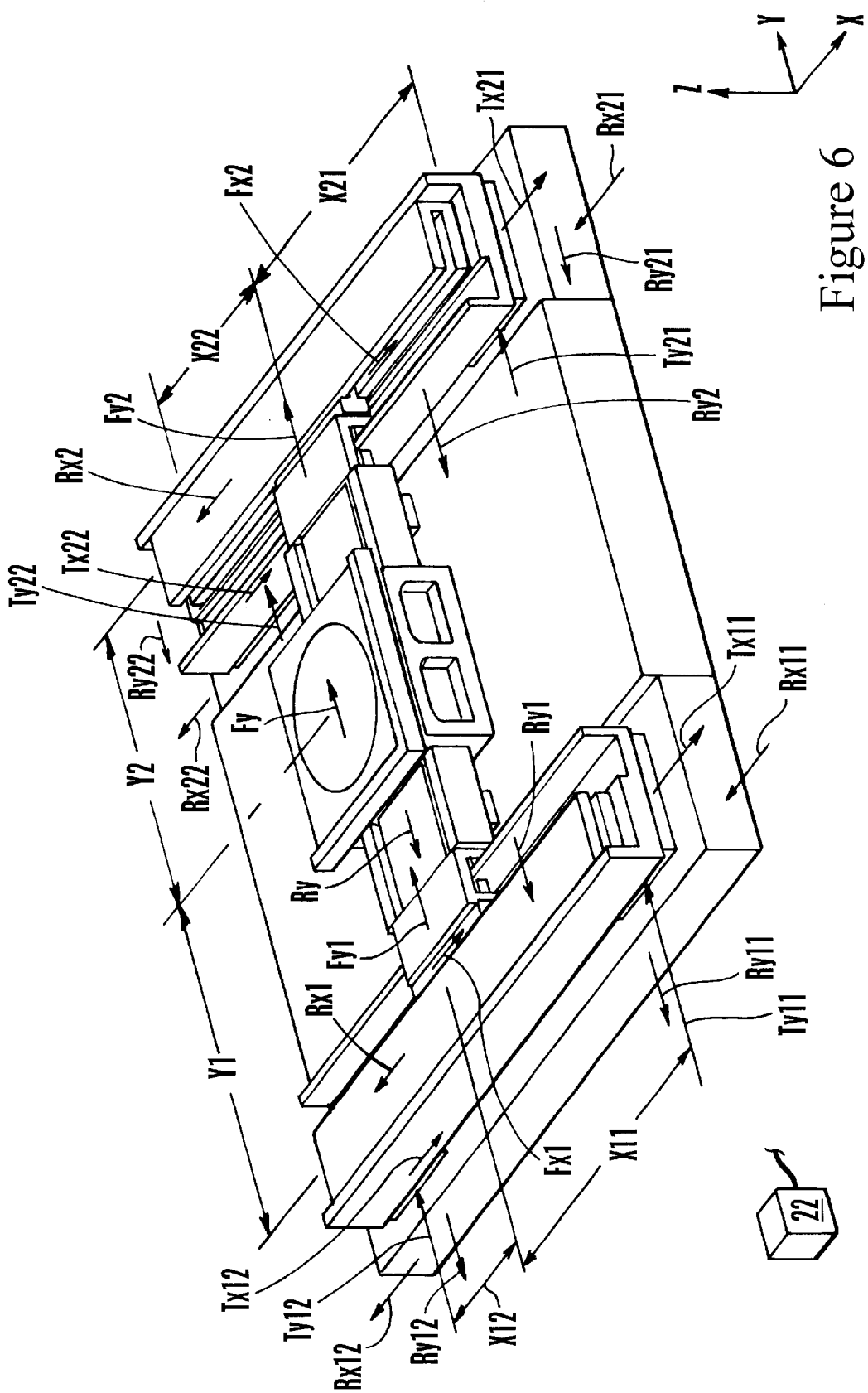
FIG. 6 is same view as FIG. 1, except FIG. 6 includes symbols used to describe the features of a control system.

FIG. 6 illustrates a simplified schematic perspective view of a portion of a stage assembly 10 that facilitates a discussion of the movement of the stage 14 and the reaction assembly 18. In particular, FIG. 6 illustrates the stage assembly 10 with the device table 48 positioned approximately half-way between the reaction masses 88, 90 along the Y axis.

The following symbols are used in conjunction with FIG. 6 and the discussion provided below to describe the movement and control of the reaction assembly 18:

Mw represents the mass of the device table 48;

Mg represents the mass of the guide assembly 50;

Mx represents the mass of the stage 14 (Mx=Mw+Mg);

M1 represents the mass of the first reaction mass 88;

M2 represents the mass of the second reaction mass 90;

My represents the total reaction mass along the Y axis, namely the combination of the mass of the guide assembly 50, the mass of the first reaction mass 88, and the mass of the second reaction mass (My=Mg+M1+M2);

Ayw represents the acceleration of the device table 48 along the Y axis;

Axw represents the acceleration of device table 48 and guide assembly 50 along the X axis;

Ay represents the acceleration of the guide assembly 50 and both reaction masses 88, 90 along the Y axis;

Ax1 represents the acceleration of the first reaction mass 88 along the X axis;

Ax2 represents the acceleration of the second reaction mass 90 along the X axis;

Fy represents the force generated by the Y table mover 80 that drives the device table 48 along the Y axis;

Ry is the reaction force generated by the Y table mover 80 that acts upon the guide assembly 50, Ry is equal in magnitude but in the opposite direction as Fy;

Fx1 represents the force generated by the first X stage mover 76A on the guide assembly 50 to move the guide assembly 50 along the X axis;

Fx2 represents the force generated by the second X stage mover 76B on the guide assembly 50 to move the guide assembly 50 along the X axis;

Rx1 represents the reaction force generated by the first X stage mover 76A along the X axis that acts upon the first reaction mass 88, Rx1 is equal in magnitude and opposite in direction to Fx1;

Rx2 represents the reaction force generated by the second X stage mover 76B along the X axis that acts upon the second reaction mass 90, Rx2 is equal in magnitude and opposite in direction to Fx2;

Fy1 represents the force generated by the first Y guide mover 78A on the guide assembly 50;

Fy2 represents the force generated by the second Y guide mover 78B on the guide assembly 50;

Ry1 represents the reaction force generated by the first Y guide mover 78A along the Y axis that acts upon the first reaction mass 88, Ry1 is equal in magnitude and opposite in direction to Fy1;

Ry2 represents the reaction force generated by the second Y guide mover 78B along the Y axis that acts upon the second reaction mass 90, Ry2 is equal in magnitude and opposite in direction to Fy2;

Fyg represents the total force acting on the guide assembly 50 along the Y axis;

Tx11 and Tx12 represent the forces along the X axis generated by the first trim movers 114A and 114B respectively on the first reaction mass 88 to move the first reaction mass 88 along the X axis;

Tx21 and Yx22 represents the force along the X axis generated by the second trim movers 116A and 116B respectively on the second reaction mass 90 to move the second reaction mass 90 along the X axis;

Ty11 and Ty12 represents the force along the Y axis generated by the first trim movers 114A and 114B respectively on the first reaction mass 88 to move the first reaction mass 88 along the Y axis;

Ty21 and Ty22 represents the force along the Y axis generated by the second trim movers 116A and 116B respectively on the second reaction mass 90 to move the second reaction mass90 along the Y axis;

Rx11 and Rx12 represents the reaction force along the X axis generated by the first trim movers 114A and 114B respectively that acts upon the first mass guide 100, Rx11 is equal in magnitude and opposite in direction of Tx11 and Tx12;

Rx21 and Rx22 represents the reaction force along the X axis generated by the second trim movers 116A and 116B respectively that acts upon the second mass guide 102, Rx21 and Rx22 are equal in magnitude and opposite in direction of Tx21 and Tx22;

Ry11 and Ry12 represents the reaction force along the Y axis generated by the first trim movers 114A and 114B respectively that acts upon the first mass guide 100, Ry11 and Ry12 are equal in magnitude and opposite in direction of Ty11 and Ty12;

Ry21 and Ry22 represents the reaction force along the Y axis generated by the second trim movers 116A and 116B respectively that acts upon the second mass guide 102, Rx21 and Ry22 are equal in magnitude and opposite in direction of Ty21 and Ty22;

Y1 represents the distance along the Y axis between the center of the device table 48 and the center of the first reaction mass 88;

Y2 represents the distance along the Y axis between the center of the device table 48 and the center of the second reaction mass 90;

X11 represents the distance along the X axis from the center of the guide assembly 50 to the center of the front first trim mover 114B of the first reaction mass 88;

X12 represents the distance along the X axis between the center of the guide assembly 50 and the center of the rear first trim mover 114A of the first reaction mass 88;

X21 represents the distance along the X axis between the center of the guide assembly 50 and the center of the front second trim mover 116A of the second reaction mass 90;

X22 represents the distance along the X axis between the center of the guide assembly 50 and the center of the rear second trim mover 116B of the second reaction mass 90;

$X_a$ represents the distance along the X axis between the center of the first reaction mass 88 and the center of the guide assembly 50 $[X_a=(X_{11}-X_{12})/2]$, $X_a$ is not illustrated in FIG. 6; and $X_b$ represents the distance along the X axis between the center of the second reaction mass 90 and the center of the guide assembly 50 $[X_b=(X_{21}-X_{22})/2]$, $X_b$ is not illustrated in FIG. 6:

Y Axis Equations

The force generated by the Y table mover 80 on the device table 48 along the Y axis is determined by Newton's second law:

$$Fy=Mw*Ayw$$

The reaction force Ry acts upon the reaction masses 88, 90 and the guide assembly 50 in the opposite direction along the Y axis. Collectively, these three bodies are represented by My. When the device table 48 is accelerated along the Y axis, My accelerates in the opposite direction. The ratio of the accelerations is the inverse ratio of the masses.

$$Ayw*Mw=-Ay*My$$

Along the Y axis Ry1 acts upon the first reaction mass 88 and Ry2 acts upon the second reaction mass 90. Ay can be used to find the Y reaction force required to accelerate each reaction mass 88, 90 is:

$$Ry1=Ay*M1=-(Ayw*Mw)(M1/My)$$

$$Ry2=Ay*M2=-(Ayw*Mw)(M2/My)$$

Because the reaction forces (Ry1 and Ry2) are equal and opposite the forces acting on the guide assembly 50, the following equations are applicable:

$$Fy1=-Ry1=Fy(M1/My)$$

$$Fy2=-Ry2=Fy(M2/My)$$

The forces along the Y axis acting on the guide assembly 50 are Ry, Fy1, and Fy2. Using these forces, the net force along the Y axis acting on the guide assembly 50, Fyg:

$$Ry=-Fy$$

$$Fyg=Ry+Fy1+Fy2$$

$$Fyg=-Fy+Fy(M1/My)+Fy(M2/My)$$

$$Fyg=Fy(M1+M2-My)/My$$

Using the fact that My=M1+M2+Mg, $$Fyg=-Fy*Mg/My$$

Substituting for Fy gives $$Fyg=Mg*(-Ayw*Mw)/My$$

Which simplifies to $$Fyg=Mg*Ay$$

This proves that using the equations above for Fy1 and Fy2 will give both reaction masses 88, 90 and the guide assembly 50 the same acceleration along the Y axis, so they all move together along the Y axis.

X Axis Equations

Along the X axis, the force balance between the first X stage mover 76A and the second X stage mover 76B can be found from these equations:

$$Axw*Mx=Fx1+Fx2$$

$$Fx1*Y1=Fx2*Y2$$

Solving for Fx1 and Fx2:

$$Fx1=Axw*Mx*Y2/(Y1+Y2)$$

$$Fx2=Axw*Mx*Y1/(Y1+Y2)$$

The corresponding reaction forces accelerate the reaction masses 88, 90 along the X axis:

$$Ax1=Rx1/M1=-Fx1/M1$$

$$Ax2=Rx2/M2=-Fx2/M2$$

This illustrates that the two reaction masses 88, 90 will experience different accelerations in the X direction.

Trim Force Equations:

Theoretically, the net trim force along the X axis and the Y axis on each reaction mass 88, 90 should be zero. In practice, some trim force along the X axis and the Y axis from the trim movers 114A, 114B, 116A, 116B will be required to compensate for external disturbances, or to reduce the stroke of the reaction masses 88, 90. Some trim force is needed, however, to counteract torque on the reaction masses 88, 90 when the guide assembly 50 is not centered along the X axis.

For the first reaction mass 88, T1 defines the magnitude of trim force by the first trim movers 114A, 114B required to cancel torque on the first reaction mass 88:

$$T1=Ty11=-Ty12=Ry1*X_a/(X11+X12)$$

Substituting Ry1=−Fy1 gives the force required from each of the first trim movers 114A, 114B along the Y axis. The same analysis applies to second reaction mass 90.

$$Ty11=-Fy1*X_a/(X11+X12)$$

$$Ty12=Fy1*X_a/(X11+X12)$$

$$Ty21=-Fy2*X_b/(X21+X22)$$

$$Ty22=Fy2*X_b/(X21+X22)$$

FIG. 7 illustrates a second embodiment of a stage assembly 10 having features of the present invention. In this embodiment, stage assembly 10 includes the stage base 12, the stage mover assembly 16, the reaction assembly 18, the measurement system 20, and the control system 22 similar to the equivalent components described above. However, in this embodiment, the stage assembly 10 includes two stages 14 that are moved independently by the stage mover assembly 16.

FIG. 8 is a schematic view illustrating an exposure apparatus 30 useful with the present invention. The exposure apparatus 30 includes the apparatus frame 202, an illumination system 204 (irradiation apparatus), a reticle stage assembly 206, the optical assembly 200 (lens assembly), and a wafer stage assembly 210. The stage assemblies 10 provided herein can be used as the wafer stage assembly 210. Alternately, with the disclosure provided herein, the stage assemblies 10 provided herein can be modified for use as the reticle stage assembly 206.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 8 supports the optical assembly 200 and the illumination system 204 and the reticle stage assembly 206 above the mounting base 24.

The illumination system 200 includes an illumination source 212 and an illumination optical assembly 214. The illumination source 212 emits a beam (irradiation) of light energy. The illumination optical assembly 214 guides the beam of light energy from the illumination source 212 to the optical assembly 200. The beam illuminates selectively different portions of the reticle 32 and exposes the semiconductor wafer 28. In FIG. 8, the illumination source 212 is illustrated as being supported above the reticle stage assembly 206. Typically, however, the illumination source 212 is secured to one of the sides of the apparatus frame 202 and the energy beam from the illumination source 212 is directed to above the reticle stage assembly 206 with the illumination optical assembly 214.

The optical assembly 200 projects and/or focuses the light passing through the reticle to the wafer. Depending upon the design of the exposure apparatus 30, the optical assembly 200 can magnify or reduce the image illuminated on the reticle.

The reticle stage assembly 206 holds and positions the reticle relative to the optical assembly 200 and the wafer. Similarly, the wafer stage assembly 210 holds and positions the wafer with respect to the projected image of the illuminated portions of the reticle in the operational area. In FIG. 8, the wafer stage assembly 210 utilizes a stage assembly 10 having features of the present invention. Depending upon the design, the exposure apparatus 30 can also include additional motors to move the stage assemblies 206, 210.

There are a number of different types of lithographic devices. For example, the exposure apparatus 30 can be used as scanning type photolithography system that exposes the pattern from the reticle onto the wafer with the reticle and the wafer moving synchronously. In a scanning type lithographic device, the reticle is moved perpendicular to an optical axis of the optical assembly 200 by the reticle stage assembly 206 and the wafer is moved perpendicular to an optical axis of the optical assembly 200 by the wafer stage assembly 210. Scanning of the reticle and the wafer occurs while the reticle and the wafer are moving synchronously.

Alternately, the exposure apparatus 30 can be a step-and-repeat type photolithography system that exposes the reticle while the reticle and the wafer are stationary. In the step and repeat process, the wafer is in a constant position relative to the reticle and the optical assembly 200 during the exposure of an individual field. Subsequently, between consecutive exposure steps, the wafer is consecutively moved by the wafer stage perpendicular to the optical axis of the optical assembly 200 so that the next field of the wafer is brought into position relative to the optical assembly 200 and the reticle for exposure. Following this process, the images on the reticle are sequentially exposed onto the fields of the wafer so that the next field of the wafer is brought into position relative to the optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 200 included in the photolithography system, the optical assembly 200 need not be limited to a reduction system. It could also be a 1× or magnification system.

With respect to a optical assembly 200, when far ultraviolet rays such as the excimer laser is used, glass materials such as quartz and fluorite that transmit far ultraviolet rays is preferable to be used. When the $F_2$ type laser or x-ray is used, the optical assembly 200 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-136475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 9:
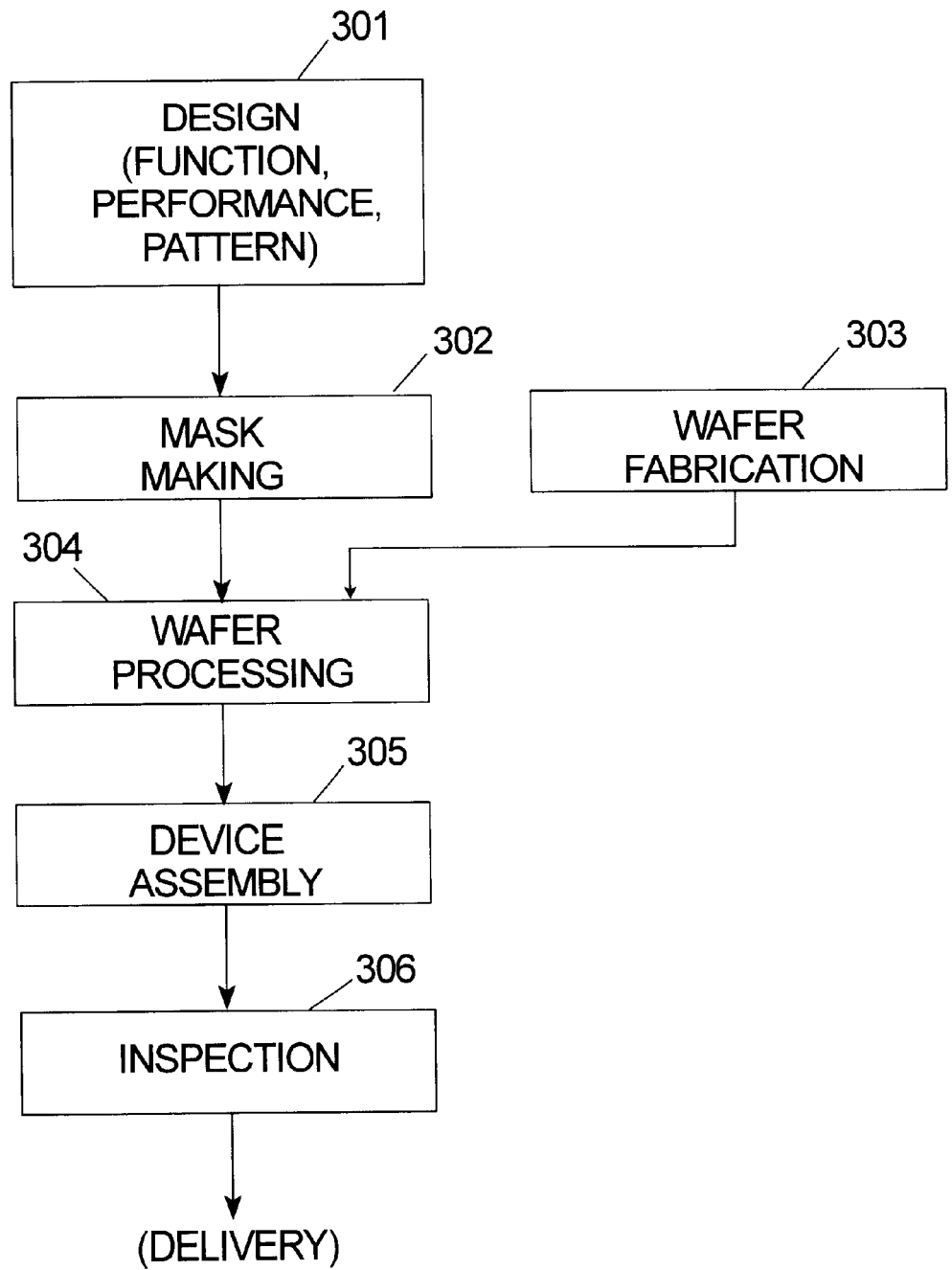
FIG. 9 is a flow chart that outlines a process for manufacturing a device in accordance with the present invention.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 10:
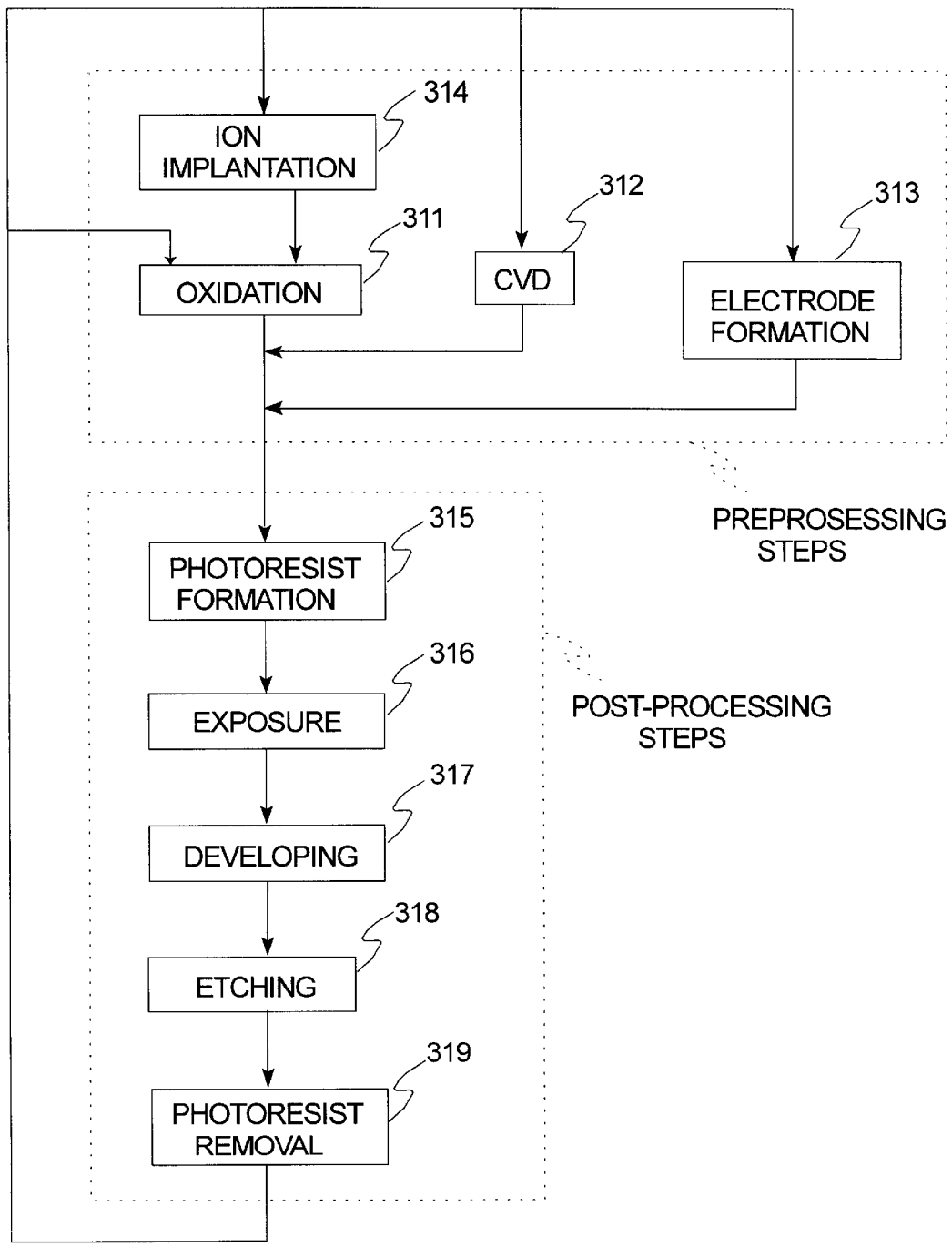
FIG. 10 is a flow chart that outlines device processing in more detail.

FIG. 10 illustrates a detailed flowchart example of the above-mentioned step 304 in the case of fabricating semiconductor devices. In FIG. 10, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device, the stage assembly comprising:
   a stage that retains the device;
   a stage mover assembly connected to the stage, the stage mover assembly moving the stage along an X axis and along a Y axis and generating reaction forces along the X axis and along the Y axis; and
   a reaction assembly coupled to the stage mover assembly, the reaction assembly including a reaction base assembly, a first reaction mass and a second reaction mass, each reaction mass moving independently relative to the reaction base assembly along the X axis and along the Y axis to reduce reaction forces along the X axis and along the Y axis.

2. The stage assembly of claim 1 wherein each reaction mass moves independently relative to the reaction base assembly about a Z axis.

3. The stage assembly of claim 1 further comprising a reaction mover assembly that independently adjusts the position of the reaction masses relative to the reaction base assembly along the X axis, along the Y axis and about a Z axis.

4. The stage assembly of claim 3 wherein the reaction mover assembly includes a planar motor that adjusts the position of the first reaction mass relative to the reaction base assembly.

5. The stage assembly of claim 1 wherein the reaction mover assembly includes a first pair of planar motors for adjusting the position of the first reaction mass.

6. The stage assembly of claim 5 wherein the reaction mover assembly includes a second pair of planar motors for adjusting the position of the second reaction mass.

7. The stage assembly of claim 1 further comprising a guide assembly, a first Y guide mover, and a second Y guide mover that cooperate to connect the first reaction mass to the second reaction mass.

8. An exposure apparatus including the stage assembly of claim 1.

9. A device manufactured with the exposure apparatus according to claim 8.

10. A wafer on which an image has been formed by the exposure apparatus of claim 8.

11. A stage assembly that moves a device, the stage assembly comprising:
a device table that retains the device;
a mover assembly connected to the device table, the mover assembly moving the device table and generating reaction forces in at least two degrees of freedom;
a first reaction mass secured to the mover assembly; and
a second reaction mass secured to the mover assembly, the second reaction mass moving with at least two degrees of freedom relative to the first reaction mass.

12. The stage assembly of claim 11 further comprising a stage base that supports the device table, wherein the first reaction mass moves in at least three degrees of freedom relative to the stage base.

13. The stage assembly of claim 11 further comprising a reaction base that supports the first reaction mass, wherein the first reaction mass moves with at least two degrees of freedom relative to the reaction base.

14. The stage assembly of claim 11 further comprising a reaction base that supports the first reaction mass, wherein the first reaction mass moves with at least three degrees of freedom relative to the reaction base.

15. The stage assembly of claim 11 further comprising a stage base that supports the device table, wherein the second reaction mass moves with at least two degrees of freedom relative to the stage base.

16. The stage assembly of claim 11 further comprising a stage base that supports the device table, wherein the second reaction mass moves in at least three degrees of freedom relative to the stage base.

17. The stage assembly of claim 11 further comprising (i) a stage base that supports the device table, and (ii) a reaction mover assembly including a first trim mover that is coupled to the first reaction mass, the first trim mover moving the first reaction mass with at least two degrees of freedom relative to the stage base.

18. The stage assembly of claim 17 wherein the first trim mover includes a first component and a second component, wherein current directed to the first component moves the first component with at least two degrees of freedom relative to the second component.

19. The stage assembly of claim 18 wherein current directed to the first component moves the first component with at least three degrees of freedom relative to the second component.

20. The stage assembly of claim 17 wherein the first trim mover includes a planar motor.

21. The stage assembly of claim 17 wherein the first trim mover moves the first reaction mass with at least three degrees of freedom relative to the stage base.

22. The stage assembly of claim 17 wherein the reaction mover assembly includes a second trim mover that is coupled to the second reaction mass, the second trim mover moving the second reaction mass with at least two degrees of freedom relative to the stage base and the first reaction mass.

23. The stage assembly of claim 22 further comprising a reaction base assembly that supports the first reaction mass and the second reaction mass, wherein the reaction base assembly is isolated from the stage base.

24. The stage assembly of claim 23 wherein the reaction base assembly includes a first mass guide that supports the first reaction mass and a second mass guide that supports the second reaction mass, wherein the first mass guide is isolated from the second mass guide.

25. The stage assembly of claim 22 wherein the reaction mover assembly adjusts the position of the first reaction mass relative to the stage base and the second reaction mass with at least two degrees of freedom, and the reaction mover assembly adjusts the position of the second reaction mass relative to the stage base and the first reaction mass with at least two degrees of freedom.

26. The stage assembly of claim 22 wherein the reaction mover assembly adjusts the position of the first reaction mass relative to the stage base and the second reaction mass with at least three degrees of freedom, and the reaction mover assembly adjusts the position of the second reaction mass relative to the stage base and the first reaction mass with at least three degrees of freedom.

27. An exposure apparatus including the stage assembly of claim 11.

28. A device manufactured with the exposure apparatus according to claim 27.

29. A wafer on which an image has been formed by the exposure apparatus of claim 27.

30. A stage assembly that moves a device, the stage assembly comprising:
a device table that retains the device;
a mover assembly connected to the device table, the mover assembly moving the device table and generating reaction forces with at least two degrees of freedom; and
a reaction assembly including a,first reaction mass coupled to the mover assembly, a second reaction mass coupled to the mover assembly, and a reaction base assembly that supports the first reaction mass and the second reaction mass, the first reaction mass moving with at least two degrees of freedom relative to the reaction base assembly and the second reaction mass moving with at least two degrees of freedom relative to the first reaction mass.

31. The stage assembly of claim 30 wherein the second reaction mass moves with at least two degrees of freedom relative to the reaction base assembly and the first reaction mass moves with at least two degrees of freedom relative to the second reaction mass.

32. The stage assembly of claim 30 further comprising (i) a first trim mover that moves the first reaction mass with at least two degrees of freedom relative to the reaction base assembly and the second reaction mass, and (ii) a second trim mover that moves the second reaction mass with at least two degrees of freedom relative to the reaction base assembly and the first reaction mass.

33. The stage assembly of claim 30 wherein the reaction base assembly includes a first mass guide that supports the first reaction mass, and a second mass guide that supports the second reaction mass, wherein the first mass guide is isolated from the second mass guide.

34. The stage assembly of claim 30 further comprising a stage base that supports the device table, wherein the first reaction mass moves with at least two degrees of freedom relative to the stage base.

35. The stage assembly of claim 34 wherein the first reaction base is isolated from the stage base.

* * * * *

UNITED STATES PATENT AND TRADEMARK OFFICE
CERTIFICATE OF CORRECTION

PATENT NO. : 6,603,531 B1
DATED : August 5, 2003
INVENTOR(S) : Binnard

It is certified that error appears in the above-identified patent and that said Letters Patent is hereby corrected as shown below:

<u>Title page,</u>
Item [56], References Cited, U.S. PATENT DOCUMENTS, "6,262,794", please replace inventor name "Ebihara et al." with -- Miyajima --.

<u>Column 21,</u>
Line 3, please replace "claim 1" with -- claim 3 --.

<u>Column 22,</u>
Line 42, please replace "a,first" with -- a first --.

Signed and Sealed this

Sixth Day of January, 2004

JAMES E. ROGAN
*Director of the United States Patent and Trademark Office*